US012684742B2

(12) United States Patent
Kögler et al.

(10) Patent No.: US 12,684,742 B2
(45) Date of Patent: Jul. 14, 2026

(54) APPARATUS FOR ENCLOSING A POWER UNIT AND FOR CENTRING A CONTROL UNIT WITH RESPECT TO THE POWER UNIT

(71) Applicant: Siemens Aktiengesellschaft, Munich (DE)

(72) Inventors: Roman Kögler, Nuremberg (DE); Bernd Roppelt, Unterhaid (DE); Jens Schmenger, Forchheim (DE); Thomas Schwinn, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 291 days.

(21) Appl. No.: 18/267,384

(22) PCT Filed: Oct. 28, 2021

(86) PCT No.: PCT/EP2021/079936
§ 371 (c)(1),
(2) Date: Jun. 14, 2023

(87) PCT Pub. No.: WO2022/128220
PCT Pub. Date: Jun. 23, 2022

(65) Prior Publication Data
US 2024/0107722 A1 Mar. 28, 2024

(30) Foreign Application Priority Data
Dec. 15, 2020 (EP) .................................... 20214263

(51) Int. Cl.
H05K 7/20 (2006.01)
H10W 40/20 (2026.01)
*H05K 7/14* (2006.01)

(52) U.S. Cl.
CPC .......... *H05K 7/209* (2013.01); *H10W 40/235* (2026.01); *H05K 7/14322* (2022.08)

(58) Field of Classification Search
None
See application file for complete search history.

(56) References Cited

U.S. PATENT DOCUMENTS

| | | | |
|---|---|---|---|
| 5,497,289 A | 3/1996 | Sugishima et al. | |
| 8,130,499 B2 * | 3/2012 | Ohnishi ................ | H01L 23/645 174/16.3 |

(Continued)

FOREIGN PATENT DOCUMENTS

| | | |
|---|---|---|
| DE | 43 33 387 A1 | 3/1994 |
| DE | 11 2005 001 446 T5 | 5/2007 |

(Continued)

OTHER PUBLICATIONS

PCT International Search Report and Written Opinion of International Searching Authority mailed Feb. 11, 2022 corresponding to PCT International Application No. PCT/EP2021/079936 filed Oct. 28, 2021.

*Primary Examiner* — Courtney L Smith
(74) *Attorney, Agent, or Firm* — Henry M. Feiereisen LLC

(57) ABSTRACT
A power converter includes an apparatus for enclosing a power unit, which is at least partially inside and/or on a heat sink, and for centering a control unit with respect to the power unit. The power unit includes a semiconductor component and a substrate. The apparatus includes a frame designed to at least partially, preferably completely, surround the substrate, two protruding pieces of a first type designed to engage in a recess or an opening in a heat sink, a protruding piece of a second type designed to engage in a recess or an opening in a control unit, and a fixing element, with at least one of the two protruding pieces of a first type (Continued)

and the fixing element being connected to one another and designed to project in opposite directions. The control unit includes an electronic component and is connected to the power module by the fixing element.

5 Claims, 4 Drawing Sheets

(56)                        References Cited

U.S. PATENT DOCUMENTS

| | | | |
|---|---|---|---|
| 8,385,078 B2 | 2/2013 | Ibori et al. | |
| 9,136,193 B2* | 9/2015 | Minamio | H01L 23/053 |
| 2002/0024120 A1* | 2/2002 | Yoshimatsu | H05K 9/0022 |
| | | | 257/659 |
| 2003/0011057 A1 | 1/2003 | Nakajima et al. | |
| 2007/0258194 A1 | 11/2007 | Okayama et al. | |
| 2008/0007919 A1 | 1/2008 | Isomoto et al. | |

| | | | |
|---|---|---|---|
| 2010/0127371 A1 | 5/2010 | Tschirbs | |
| 2014/0035118 A1* | 2/2014 | Bayerer | H01L 25/072 |
| | | | 438/122 |
| 2014/0168900 A1 | 6/2014 | Korich et al. | |
| 2014/0204536 A1* | 7/2014 | Jones | H05K 7/20409 |
| | | | 361/728 |
| 2015/0116945 A1 | 4/2015 | Minamio | |
| 2022/0020651 A1 | 1/2022 | Umeda et al. | |
| 2023/0124688 A1* | 4/2023 | Nottelmann | H05K 3/303 |
| | | | 361/720 |

FOREIGN PATENT DOCUMENTS

| | | |
|---|---|---|
| DE | 11 2005 002 218 T5 | 8/2007 |
| DE | 10 2013 225 627 A1 | 6/2014 |
| DE | 10 2013 100 701 A1 | 7/2014 |
| EP | 2 395 647 A1 | 12/2011 |
| JP | 2007103603 A | 4/2007 |
| WO | WO 2008/087875 A1 | 7/2008 |

* cited by examiner

APPARATUS FOR ENCLOSING A POWER UNIT AND FOR CENTRING A CONTROL UNIT WITH RESPECT TO THE POWER UNIT

CROSS-REFERENCES TO RELATED APPLICATIONS

This application is the U.S. National Stage of International Application No. PCT/EP2021/079936, filed Oct. 28, 2021, which designated the United States and has been published as International Publication No. WO 2022/128220 A1 and which claims the priority of European Patent Application, Ser. No. 20/214,263.4, filed Dec. 15, 2020, pursuant to 35 U.S.C. 119 (a)-(d).

BACKGROUND OF THE INVENTION

The invention relates to an apparatus for enclosing a power unit, which is at least partially inside and/or on a heat sink, and for centring a control unit with respect to the power unit.

A power unit known from the prior art has a housing which is screwed to a heat sink. This requires a bore with a thread in the heat sink. However, this impairs cooling of the power unit as in particular a desired number of coding fins is not possible. In addition, maintaining a distance between the cooling fins, which ensures an optimal flow of, for example, air is not always possible.

SUMMARY OF THE INVENTION

The object of the invention is to improve this.
The object is achieved by a power module, comprising:
at least one heat sink,
at least one power unit, the power unit comprising at least one semiconductor component and a substrate,
an apparatus for enclosing the power unit at least partially inside and/or on the heat sink and for centring a control unit with respect to the power unit, the apparatus comprising:
a frame, the frame at least partially, preferably completely, surrounding the substrate,
at least one protruding piece of a first type, said protruding piece of the first type engaging in a recess or an opening of the heat sink,
at least one protruding piece of a second type, the protruding piece of the second type being designed to engage in a recess or an opening of a control unit comprising at least one electronic component, the frame being fixed on the heat sink by means of bonding.

The apparatus is preferably in one piece.
The substrate advantageously acts as a conducting element.
The substrate comprises, for example, at least one electrically conductive layer, the electrically conductive layer preferably comprising copper, and at least one thermally conductive layer, the thermally conductive layer preferably comprising ceramic.

The thermally conductive layer is advantageously electrically insulating. This is intended, on the one hand, to produce insulation and on the other hand, to dissipate waste heat. Ceramic is advantageous here as the production of the electrical insulation is particularly successful as a result.

Particularly advantageously, the substrate has three layers. A first layer, which faces the heat sink, preferably comprises copper. A second layer, which adjoins the first layer, preferably comprises ceramic. A third layer, which adjoins the second layer, preferably comprises copper. The first and the third layer are thus electrically conductive layers, the second layer is thus a thermally conductive layer. The thermally conductive layer is advantageously electrically insulating.

The conducting element preferably comprises at least one semiconductor component, preferably a plurality of semiconductor components, on the third layer.

The power unit is preferably part of a converter system or inverter system.

The apparatus replaces the previous housing and is greatly simplified in terms of construction. In addition, the invention also makes it possible to reduce the overall size with sufficient and uniform cooling.

The power unit can be designed at least partially inside and/or on a heat sink.

The power unit is preferably designed on a surface of the heat sink.

However, it is possible for the heat sink to have a notch or recess in which the power unit is completely or only partially embodied.

An embodiment is advantageous, according to which the apparatus has two protruding pieces of the first type.

This is explained hi more detail in the description of the figures.

The apparatus is designed in such a way that it can be securely positioned on the heat sink as rotation is prevented by the protruding pieces of the first type.

An embodiment is advantageous, according to which the apparatus has a fixing element for fixing the control unit.

The fixing element is advantageously an apparatus which is designed for a non-positive connection and/or a positive connection to a further body.

The fixing element is, for example, an apparatus with an internal thread, which is designed to receive a body with an external thread, for example a screw.

Detachability is ensured by a screw, Therefore, this embodiment is preferred.

The fixing element is described in more detail in the description of the figures.

An embodiment is advantageous, according to which the frame is rectangular in design.

However, other shapes of the frame are also conceivable.

An embodiment is advantageous, according to which the protruding piece of a first type is arranged at least substantially at a corner, in particular an outer corner, of the frame.

An embodiment is advantageous, according to which the protruding piece of a second type is arranged at least substantially at a corner, in particular an outer corner, of the frame.

An embodiment is advantageous, according to which at least one protruding piece of a first type and the protruding piece of the second type are connected to one another and are designed to project in opposite directions.

An embodiment is advantageous, according to which at least one protruding piece of a first type and the fixing element are connected to one another and are designed to project in opposite directions.

The embodiments described are explained in more detail in the description of the figures.

An embodiment according to which the frame has polyphenylene sulfide (abbreviated: PPS) is advantageous.

PPS is advantageous as this is a high-temperature resistant thermoplastic plastic.

An embodiment is advantageous, for example, according to which the frame has polyphenylene sulfide with a fiber content of 50% to 75%, in particular 60% to 65%.

However, other plastics can also be used.

An embodiment according to which the frame is designed in such a way that an applied casting compound remains within an area which is delimited by the frame and the power module is advantageous.

The casting compound is advantageously an insulation material, in particular silicone gel. In addition, polyurethane and/or epoxides are suitable. Other types are also conceivable.

The casting compound is advantageously applied as grouting within the frame and then cured.

Advantageously, the power unit is at least partially, preferably completely covered by the casting compound. Embodiments in which the power unit is surrounded by casting compound are also conceivable.

This is advantageous as the semiconductor component can thus be operated at its nominal voltages.

An embodiment is advantageous according to which the frame is connected to a surface of the power module hi a materially bonded manner, in particular by means of bonding.

This ensures a secure hold, A materially bonded connection is advantageous as no fastening apparatuses have to be provided in the heat sink as a result. The heat sink can be designed and configured in such a way that cooling, in particular with respect to its cooling fin spacing, is optimal.

However, other connections are also possible.

The above object is also achieved by a power converter, comprising:

a power module, a control unit having at least one electronic component, wherein the power module and the control unit are connected to one another.

An embodiment is advantageous according to which the control unit is centered with respect to the power module by an engagement of the protruding piece of the second type of the power module in a recess or an opening of the control unit.

An embodiment is advantageous, according to which the power module and the control unit are connected by means of the fixing element.

This is explained in more detail in the description of the figures.

BRIEF DESCRIPTION OF THE DRAWING

The invention is described and explained in more detail hereinafter with reference to the exemplary embodiments shown in the figures. It is shown in.

DETAILED DESCRIPTION OF PREFERRED EMBODIMENTS

Figure 1:
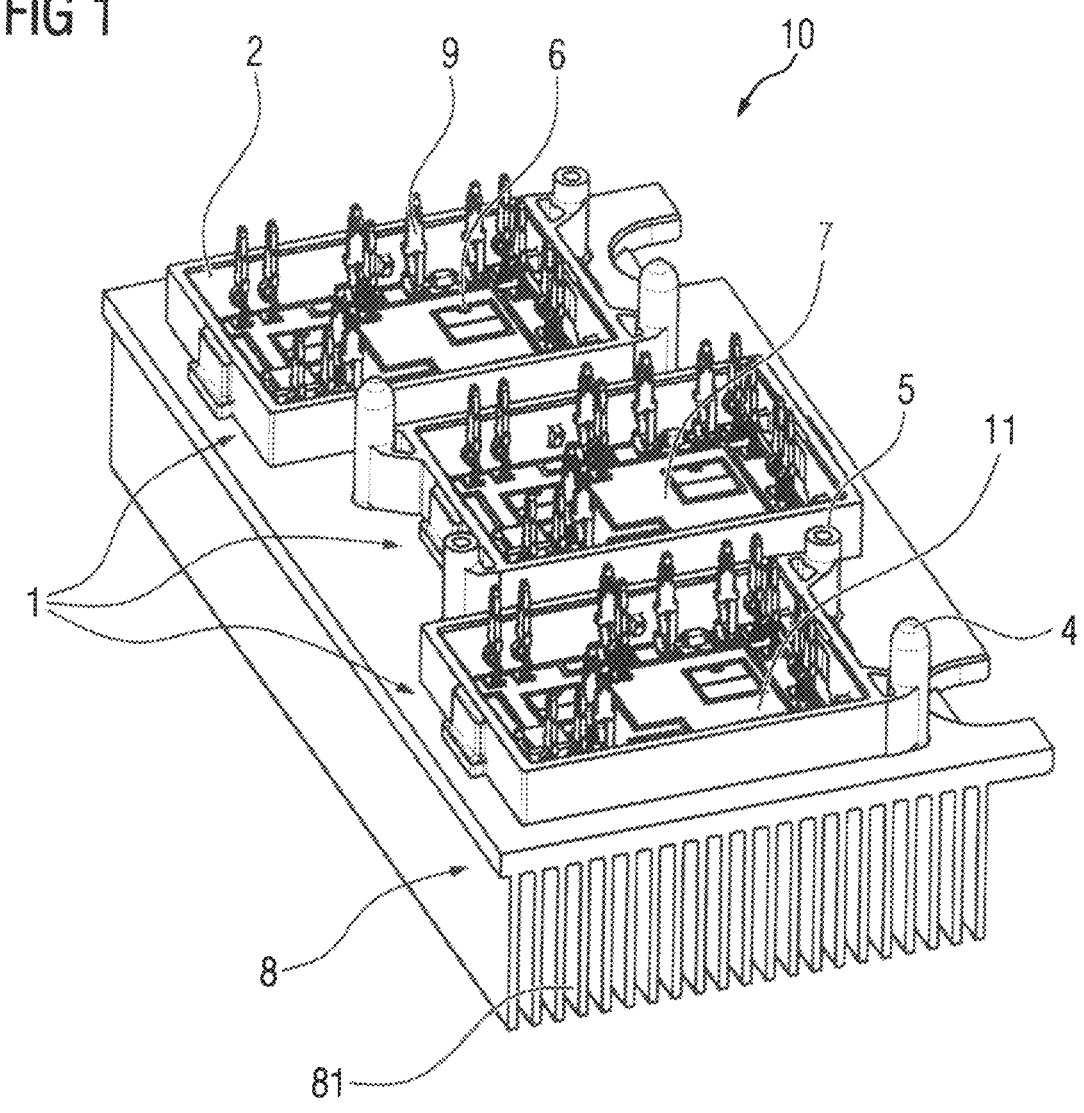
FIG. 1 a possible embodiment of a power module.

FIG. 1 shows a possible embodiment of a power module 10, having an apparatus 1.

Figure 2:
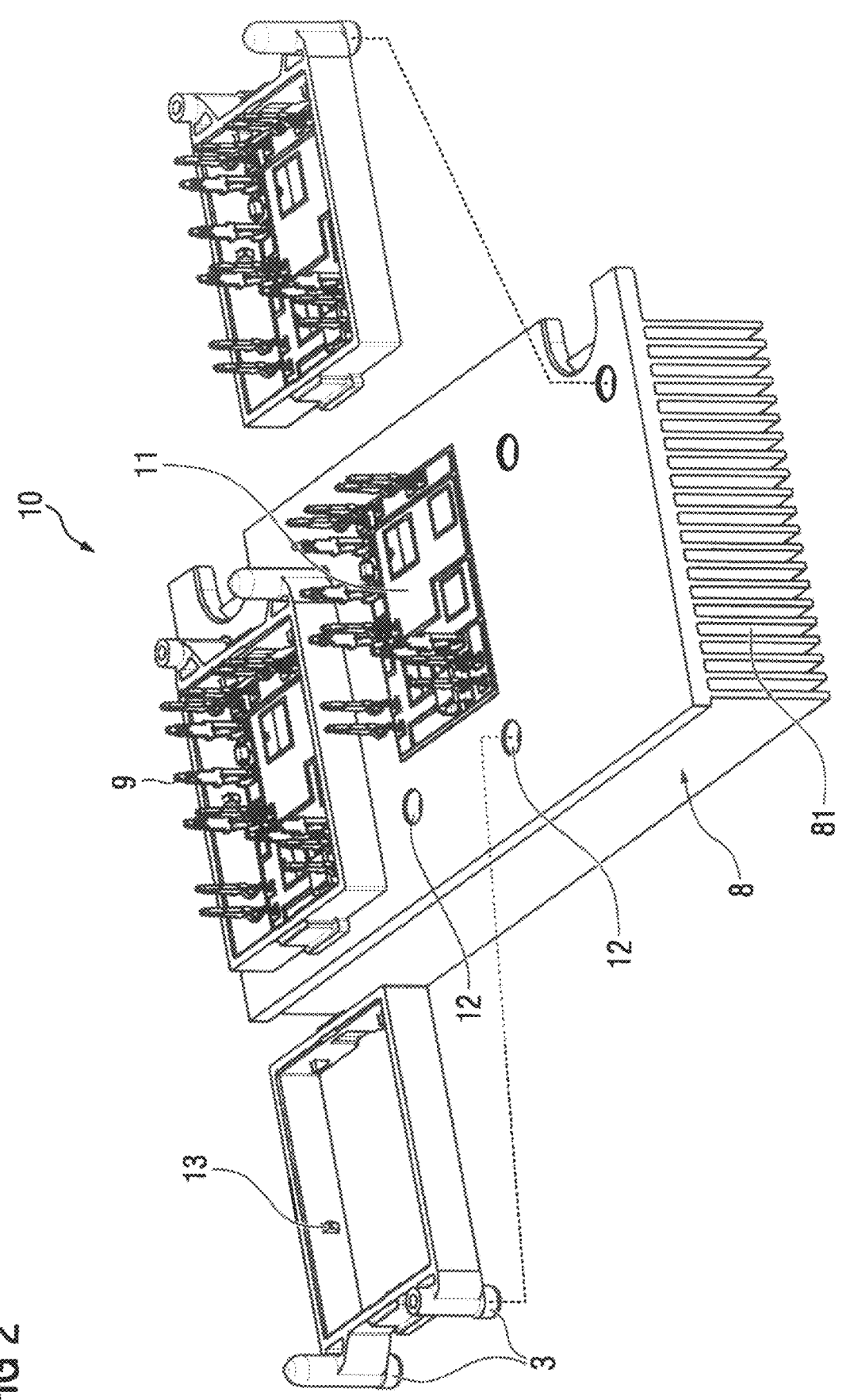
FIG. 2 the possible embodiment from FIG. 1 in an exploded view.

FIG. 2 shows the possible embodiment from FIG. 1 in an exploded view.

The apparatus 1 encloses a power unit 11 formed on the power module 10.

The power unit 11 comprises at least one semiconductor component 6. This is in particular a power semiconductor, for example IGBT, The power unit 11 further comprises a substrate 7.

The apparatus 1 comprises a frame 2, the frame 2 completely surrounding the substrate 7.

The apparatus 1 further comprises two protruding pieces of the first type 3 (shown in FIG. 2), a first protruding piece 3 being designed to engage in a notch or recess 12, for example a blind hole, or an opening of a heat sink 8 of the power module 10.

Figure 3:
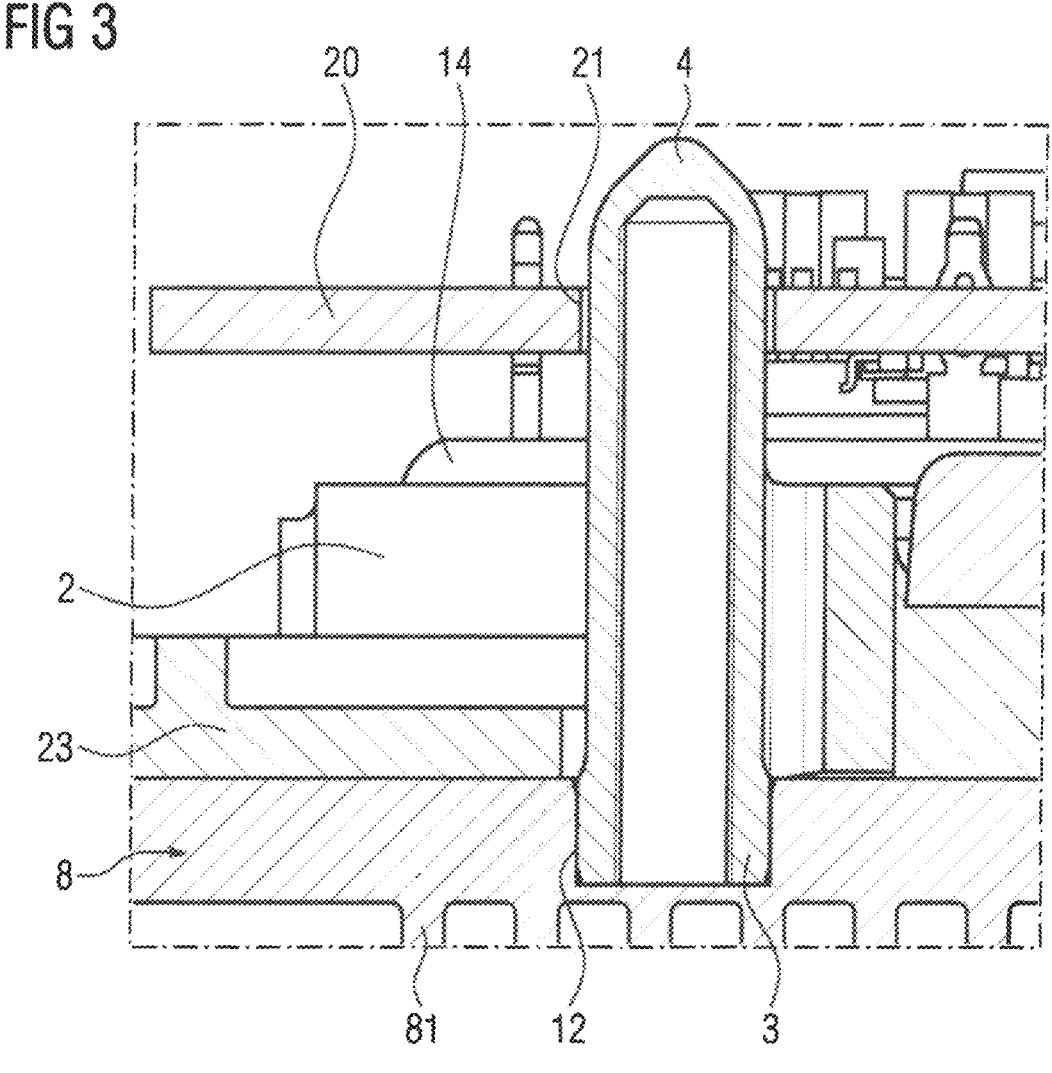
FIG. 3 and FIG. 4 a power module which is connected to a control unit.

The apparatus 1 also comprises at least one protruding piece of a second type 4, the protruding piece of the second type 4 being designed to engage in a notch or recess or an opening 21 (see FIG. 3), for example, a hole, of a control unit 20 comprising at least one electronic component (see FIG. 3).

The control unit 20 is advantageously a motherboard.

FIG. 1 also shows contacting elements 9. A contacting element is preferably a pin. Advantageously, the power unit 11 has a plurality of contacting elements 9. The contacting elements 9 can be designed as individual pins or as a multi-part pin system.

The heat sink 8 has a plurality of cooling fins 81. The cooling fins 81 are advantageously arranged in parallel.

The apparatus 1 has a fixing element 5, as shown in FIG. 1. The fixing element 5 is designed for fixing the control unit 20. This is described in more detail in FIG. 4.

The frame 2 is rectangular, as shown in FIG. 1. However, other shapes are also conceivable, such as, for example, a round frame, an oval frame, a square frame or a trapezoidal frame.

FIG. 1 and FIG. 2 show that the protruding piece of a first type 3 is arranged at least substantially at an outer corner or in the area of the outer corner of the frame 2.

FIG. 1 and FIG. 2 also show that the protruding piece of the second type 4 is arranged at least substantially at an outer corner or in the area of the outer corner of the frame 2.

A diagonal arrangement with respect to one another is also conceivable.

Advantageously, at least one protruding piece of a first type 3 and the protruding piece of the second type 4 are connected to one another and are designed to project in opposite directions.

An embodiment is advantageous, according to which at least one protruding piece of a first type and the fixing element are connected to one another and are designed to project in opposite directions. This can be achieved by a cylindrical body which has the protruding piece of a first type 3 at one end and the protruding piece of the second type 4 at the other end.

The protruding piece of the first type 3 is advantageously designed as a positioning pin.

In this way, a precise positioning of the apparatus 1 on a surface of the heat sink 8 is achieved. Advantageously, there is no positive and/or non-positive connection in this case.

Fixing of the frame 2 on the heat sink 8 is achieved, for example, by means of bonding.

The protruding piece of the first type 3 advantageously has a shape which fits, at least substantially, precisely into the recess 12 or opening of the heat sink 8.

The protruding piece of the first type 3 advantageously has a round cross section. However, other shapes are also conceivable.

The protruding piece of the second type 4 is advantageously designed as a centring dome. This enables precise centring of the control unit. No guide tools are required.

The frame 2 is advantageously designed in such a way that an applied casting compound remains within an area which is delimited by the frame 2 and the power module 10 or one side of the power module 10.

For this purpose, the frame 2 is advantageously connected to a surface of the power module 10 in a materially bonded manner, in particular by means of bonding.

Silicone is particularly suitable as a casting compound. Polyurethane and/or epoxide are also conceivable.

Silicone is resistant to high temperatures. In addition, silicone solidifies at room temperature or with the aid of UV light.

Moreover, silicone has very good electrically insulating properties, low viscosity and good flow behavior.

The power unit 11 is advantageously connected to the heat sink 8. This connection is preferably achieved by means of pressing and/or soldering and/or sintering. However, other types of connections, in particular a connection by means of other thermally conductive materials, are also conceivable.

In addition, connections which are achieved by an input of thermal energy are also possible, for example, welding.

The power unit 11 is advantageously designed as part of a module-specific heat sink.

The power unit is advantageously Direct Copper Bonded (also referred to as DCB) in design.

The module-specific heat sink advantageously comprises the power unit 11 and contacting elements.

A heat sink 8 advantageously has at least one power unit 11. However, a heat sink 8 may also comprise two or more power units 11.

It is optimal if a heat sink 8 comprises three power units 11. This ensures good cooling with optimal utilization in terms of performance.

Three power units 11 are advantageous as in each case one power unit can be assigned to one phase of a three-phase system.

The semiconductor component 6 is, for example, a thyristor or a MOSFET or an IGBT. Other semiconductor components are also conceivable.

If the semiconductor component 6 is designed as an IGBT, a freewheeling diode is also required. Other semiconductor components are also conceivable.

The control unit 20 is preferably a power board (also referred to as a motherboard), that is to say a printed circuit board together with components, and is preferably used for control and power supply, preferably by means of DC voltage.

FIG. 2 also shows an apparatus which is designed to support a cover. The apparatus has, for example, a plurality of lugs 13.

The cover 14 is shown in FIG. 3. The cover sometimes makes it possible to guide the pins 9. The cover can have recesses for this purpose.

In addition, the cover 14 provides protection in the event of explosions, in performance tests, a demand is placed on the semiconductor components or they are overloaded in such a way that explosions can occur. The cover serves to protect the environment, in particular to protect the inverter or power converter.

For this purpose, the cover has, for example, glass-fiber-reinforced polycarbonate.

Figure 4:
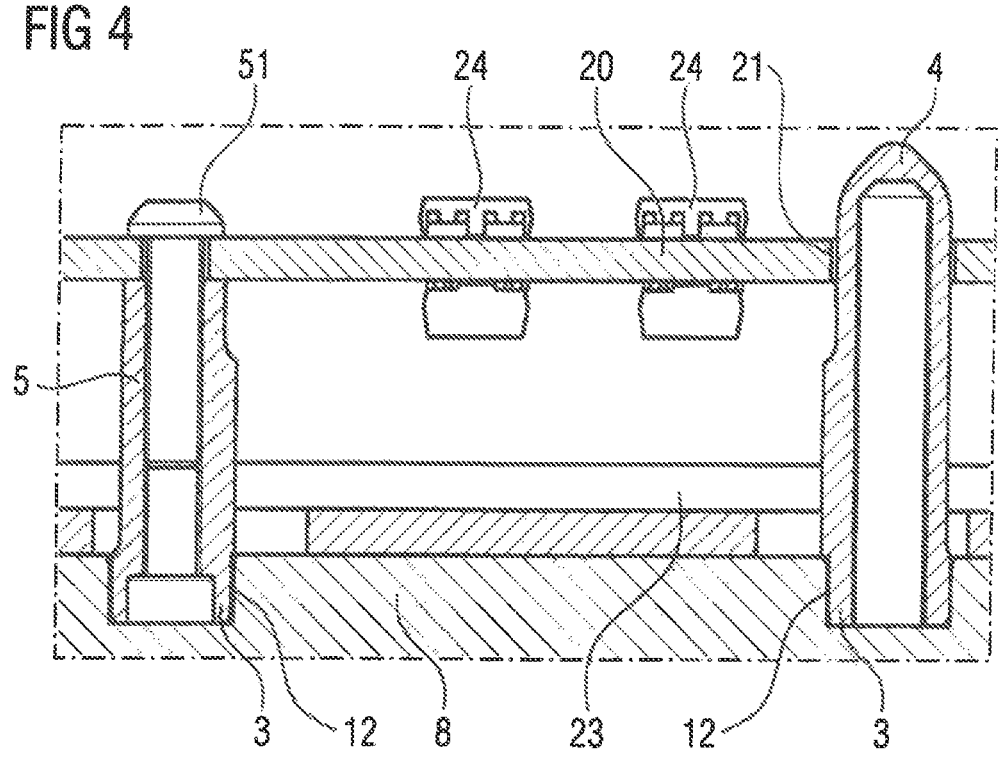

FIG. 3 and FIG. 4 show the power module 10 which is connected to the control unit 20.

FIG. 4 shows a plurality of electronic components 24.

An electronic component 24 is, for example, a capacitor, a resistor or a diode. Other components are also possible. The electronic components 24 are preferably used for actuation.

The protruding piece of the second type 4 advantageously engages in a recess or, as shown in FIGS. 3 and 4, an opening 21 of the control unit 20.

This enables good centring.

FIG. 4 also shows a heat sink cover or a holding frame 23.

FIG. 4 shows a fixing element 5.

This serves to fix the control unit 20. The fixing element is advantageously designed in such a way that the control unit is supported.

Furthermore, the fixing element 5 advantageously has a cavity in which, for example, a thread is formed. This offers the advantage that the control unit 5 can be fixed by means of a screw 51.

Furthermore, it is possible for the fixing element 5 to have a cavity in such a way that a thread-forming or self-tapping screw can be attached.

The power module 10 is preferably part of a converter system. The converter system is preferably high-performance and is particularly suitable for driving production and machine tools as well as in the glass and/or packaging industry. Further fields of application are heating, ventilation, air-conditioning, pumps and standard fans as well as various converter applications.

The invention offers the advantage that process, assembly and manufacturing steps are simplified and costs, in particular with regard to the material used, can be reduced. Significantly less material must be used for the apparatus described than for a previously customary housing.

As a result, the power converter is also lighter.

Instead of screwing an enclosed power unit onto the heat sink and inserting sockets in the housing for this purpose, the apparatus described is advantageously mounted directly on the heat sink.

For easier positioning and securing against rotation, at least two pins are advantageously provided, which only dip into a hole, preferably a blind hole, with a minimum depth for positioning. The depth is preferably 1 mm to 5 mm.

The heat sink 8 together with the power unit 11 is advantageously guided into the motherboard by means of the at least one positioning pin in a function as a positioning tool and thus enables positioning.

A continuous mechanical connection from the heat sink 8 to the motherboard is advantageously created by means of the screw 51 on the fixing element. With this connection, a direct alignment of these components by the positioning pin is additionally created. This promotes better structural coordination of the components.

Figure 5:
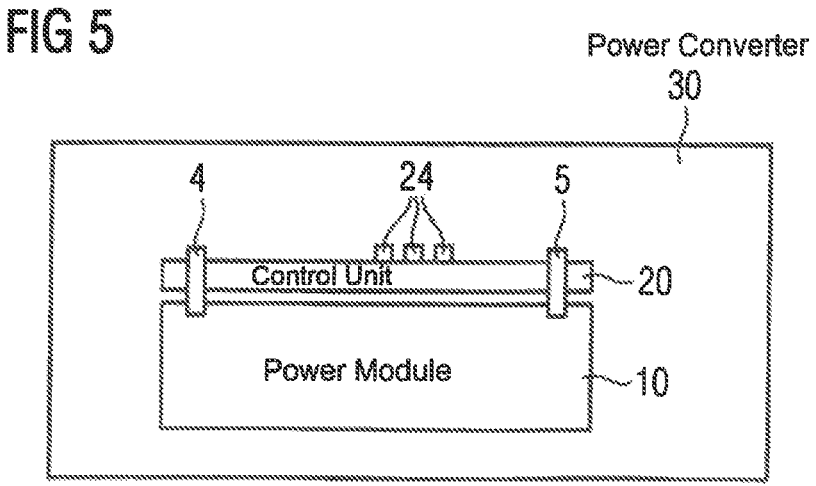
FIG. 5 a power converter.

FIG. 5 shows a power converter 30.

The power converter 30 has at least one power module 10, which has already been described. The power converter can also have a plurality of power modules 10.

The power converter also has a control unit 20 comprising at least one electronic component 24.

The power module 10 and the control unit 20 are, as shown in FIG. 5, connected to one another.

What is claimed is:

1. A power converter, comprising:

a power module comprising:

a heat sink, a power unit disposed at least partially inside and/or on the heat sink and comprising a semiconductor component and a substrate, said substrate including three layers defined by a first layer which faces the heat sink and comprises copper, a second layer which adjoins the first layer and comprises ceramic, and a third layer which adjoins the second layer and comprises copper, an apparatus enclosing the power unit and comprising a frame at least partially surrounding the substrate and fixed directly on the heat sink through bonding, the frame further comprising a plurality of outer corners, said apparatus comprising two protruding pieces of a first type designed to each engage in a recess or an opening of the heat sink, and a fixing element, with at least one of the two protruding pieces of the first type and the fixing element being connected to one another, connected to one of the plurality of outer corners and designed to project in opposite directions, and a protruding piece of a second type, with at least another one of the two protruding pieces of the first type and the protruding piece of the second type being connected to one another connected to another one of the plurality of outer corners and designed to project in opposite directions; and control unit comprising an electronic component and fixed by the fixing element of the apparatus, said control unit connected to the power module by the fixing element and centered with respect to the power module by engagement of the protruding piece of the second type of the power module in a recess or an opening of the control unit.

2. The power converter of claim 1, wherein the frame completely surrounds the substrate.

3. The power converter of claim 1, wherein the frame is rectangular in shape.

4. The power converter of claim 1, wherein the frame includes polyphenylene sulfide.

5. The power converter of claim 1, wherein the frame is designed in such a way that an applied casting compound remains within an area which is delimited by the frame and the power module.

\* \* \* \* \*